United States Patent … US 7,632,706 B2
Yudanov et al. … Dec. 15, 2009

(54) SYSTEM AND METHOD FOR PROCESSING AN ORGANIC MEMORY CELL (75) Inventors: Nicolay F. Yudanov, Brookline, MA (US); Igor Sokolik, East Boston, MA (US); Richard P. Kingsborough, North Chelmsford, MA (US); William G. Leonard, Brookline, MA (US); Suzette K. Pangrle, Cupertino, CA (US); Nicholas H. Tripsas, San Jose, CA (US); Minh Van Ngo, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 648 days.

(21) Appl. No.: 11/256,558

(22) Filed: Oct. 21, 2005

(65) Prior Publication Data

US 2007/0090343 A1   Apr. 26, 2007

(51) Int. Cl.
H01L 51/40 (2006.01)
(52) U.S. Cl. .................... 438/99; 438/238; 438/239; 438/393; 438/396; 257/40; 257/E27.016
(58) Field of Classification Search .................... 257/40; 438/99, 238, 239, 393, 396
See application file for complete search history.

(56) References Cited

U.S. PATENT DOCUMENTS

| | | |
|---|---|---|
| 6,397,776 B1 | 6/2002 | Yang et al. |
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,768,157 B2 | 7/2004 | Krieger et al. |
| 6,770,905 B1* | 8/2004 | Buynoski et al. .............. 257/40 |
| 6,773,954 B1 | 8/2004 | Subramanian et al. |
| 6,781,868 B2 | 8/2004 | Bulovic et al. |
| 6,787,458 B1 | 9/2004 | Tripsas et al. |
| 6,803,267 B1 | 10/2004 | Subramanian et al. |
| 6,825,060 B1 | 11/2004 | Lyons et al. |
| 6,852,586 B1 | 2/2005 | Buynoski et al. |
| 6,858,481 B2 | 2/2005 | Krieger et al. |
| 6,864,522 B2 | 3/2005 | Krieger et al. |
| 6,878,961 B2 | 4/2005 | Lyons et al. |
| 2004/0159835 A1 | 8/2004 | Krieger et al. |

(Continued)

OTHER PUBLICATIONS

International Search Report for PCT/US2006/039398 dated Aug. 1, 2007.

*Primary Examiner*—Wai-Sing Louie
(74) *Attorney, Agent, or Firm*—Turocy & Watson, LLP (57) ABSTRACT

A system and method are disclosed for processing an organic memory cell. An exemplary system can employ an enclosed processing chamber, a passive layer formation component operative to form a passive layer on a first electrode, and an organic semiconductor layer formation component operative to form an organic semiconductor layer on the passive layer. A wafer substrate is not needed to transfer from a passive layer formation system to an organic semiconductor layer formation system. The passive layer is not exposed to air after formation of the passive layer and before formation of the organic semiconductor layer. As a result, conductive impurities caused by the exposure to air do not occur in the thin film layer, thus improving productivity, quality, and reliability of organic memory devices. The system can further employ a second electrode formation component operative to form a second electrode on the organic semiconductor layer.

14 Claims, 4 Drawing Sheets

U.S. PATENT DOCUMENTS

2005/0051094 A1    3/2005  Schaepkens et al.
2005/0145263 A1 *  7/2005  Ching et al. .................... 134/1
2008/0296560 A1 *  12/2008 Hirakata et al. ............... 257/40

* cited by examiner

SYSTEM AND METHOD FOR PROCESSING AN ORGANIC MEMORY CELL

TECHNICAL FIELD

The subject invention generally relates to a system and method for processing an organic memory cell, and in particularly to forming an organic semiconductor layer without exposure of a passive layer to air.

BACKGROUND ART

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller feature sizes and more precise feature shapes are required. This may include the width, thickness and spacing of interconnecting lines, spacing and diameter of contact holes, and the surface geometry, such as corners and edges, of various features.

The requirement of small features with close spacing between adjacent features requires sophisticated manufacturing techniques to ensure that quality and operability of the features are not compromised for the purpose of reducing feature size. Among the many aspects related to improving semiconductor fabrication processing to achieve higher density devices, the ability to deposit continuous, amorphous or crystalline thin films, which are substantially free from impurities and defects, remains critical to the structural integrity of smaller features as well as to the performance of the device with respect to increasing the speed of the device. Even minor impurities or defects present on the thin film layer tend to result in poor device characteristics, thereby reducing the effectiveness of the semiconductor device.

Several techniques for depositing thin films are known in the art. One exemplary technique for depositing a thin film is via chemical vapor deposition (CVD), wherein a wafer is introduced into a process chamber, heated to a desired temperature and gases are flown to initiate the deposition process. In CVD, a combination of inert carrier gasses and reactant gasses are introduced into the chamber wherein the elevated wafer temperature causes the reactive gasses to break down on the wafer surface thereby depositing the desired thin film on the wafer surface. To maintain the desired chemical reaction, the desired temperature in the chamber and at the wafer surface must be maintained. Accordingly, the wafer may be in continuous and direct contact with a means for heating the wafer.

Another method for depositing thin films is via plasma enhanced chemical vapor deposition (PECVD). When PECVD is used to produce thin films, vapors including elements such as fluorine and carbon may be employed in cleaning the deposition chamber wherein the PECVD occurs. Novel deposition techniques are used for new materials employed in the semiconductor industry. For example, in deposition techniques such as MOCVD (Metal Organic Chemical Vapor Deposition), PLD (Pulsed Laser Deposition), ALCVD (Atomic Layer Chemical Vapor Deposition) and LPCVD (Low Pressure Chemical Vapor Deposition), which use liquid or solid precursors, the remnants of carbon or other unreacted organic or metal particles can be incorporated in the films, leading to failure of the device.

Exposure of the layers to air during the manufacturing process of semiconductor device may cause conductive impurities in the thin film layers. Such impurities can negatively impact the quality of the manufactured chip by altering the desired electrical properties of and interactions between components on the manufactured chip. Thus, an efficient system and/or method to process thin film formations and are desired to increase productivity, quality, and reliability in IC manufacture.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides a system that facilitates formation a passive layer and an organic semiconductor layer involved in organic memory cell manufacturing. An exemplary system can employ an enclosed processing chamber, a passive layer formation component operative to form a passive layer on one or more portions of a first electrode, and an organic semiconductor layer formation component operative to form an organic semiconductor layer on the passive layer. A wafer substrate is not needed to transfer from a passive layer formation system to an organic semiconductor layer formation system. The passive layer is not exposed to air after formation of the passive layer and before formation of the organic semiconductor layer. As a result, conductive impurities caused by the exposure to air do not occur in the thin film layer, thus improving productivity, quality, and reliability of organic memory devices. The system of the subject invention can further employ a second electrode formation component operative to form a second electrode on the organic semiconductor layer.

One or more passive layer formation components can be employed associated with the enclosed processing chamber. The passive layer formation component may be, for example, a chemical vapor deposition (CVD) component. Any suitable passive layer formation components may be employed with the subject invention. For example, components that use physical vapor deposition (PVD) techniques, oxidation techniques, or gas phase reactions may be employed in accordance with the subject invention.

One or more organic semiconductor layer formation components can be employed associated with the enclosed processing chamber. The organic semiconductor layer formation component may be, for example, a CVD component. Any suitable organic semiconductor layer formation components may be employed with the subject invention. For example, components that use PVD techniques, liquid deposition techniques, or gas phase deposition techniques for forming an organic semiconductor layer may be employed in accordance with the subject invention.

Another aspect of the subject invention provides a method for processing an organic memory cell. The method comprises holding one or more substrates comprising a first electrode in an enclosed processing chamber, forming a passive layer on one or more portions of the first electrode, and forming an organic semiconductor layer on the passive layer. A wafer substrate is not needed to transfer from a passive layer formation system to an organic semiconductor layer formation system. The passive layer is not exposed to air after formation of the passive layer and before formation of the organic semiconductor layer. As a result, conductive impurities caused by the exposure to air do not occur in the thin film layer, thus improving productivity, quality, and reliability of organic memory devices. The method of the subject invention can further comprise forming a second electrode on the organic semiconductor layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The subject invention is now described with reference to the drawings, wherein like reference numerals are used to refer to like elements throughout.

The subject invention involves a system and method for processing an organic memory cell. An organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like. The controllably conductive media contains an organic semiconductor layer and passive layer.

The organic memory cells may optionally contain additional layers, such as additional electrodes, charge retention layers, and/or chemically active layers between or in addition to the two electrodes and the controllably conductive media. The impedance of the controllably conductive media changes when an external stimulus such as an applied electric field is imposed. A plurality of organic memory cells, which may be referred to as an array, form an organic memory device.

Figure 1:
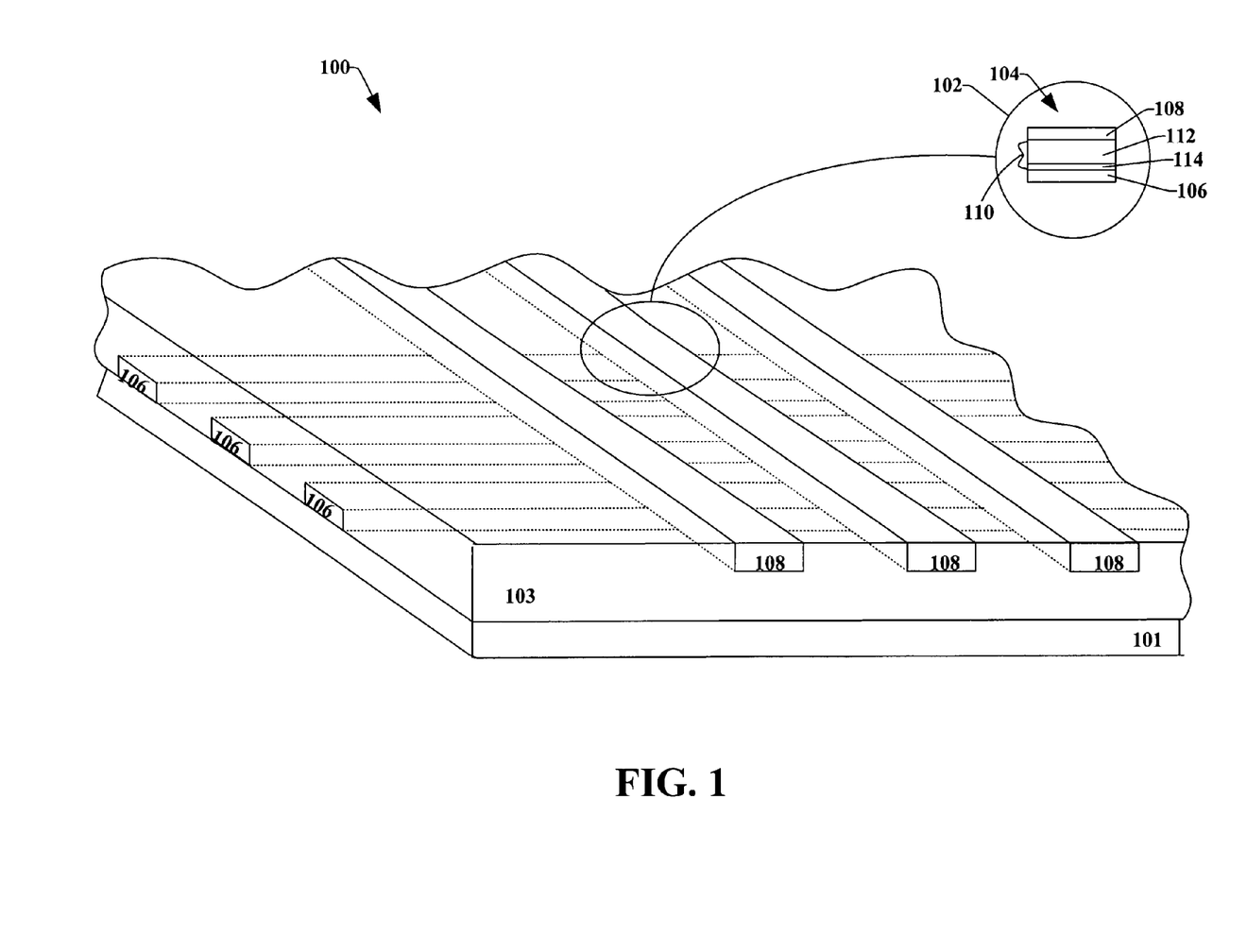
FIG. 1 illustrates a perspective view of a three dimensional microelectronic device containing a plurality of organic memory cells within a dielectric in accordance with one aspect of the invention.

Referring to FIG. 1, a brief description of a microelectronic organic memory device 100 containing a plurality of organic memory cells is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and passive layer 114. Peripheral circuitry and devices are not shown for brevity.

Examples of electrodes include one or more of aluminum, chromium, cobalt, copper, germanium, hafnium, gold, magnesium, manganese, molybdenum, indium, iron, nickel, palladium, platinum, samarium, silver, titanium, tungsten, zinc, and alloys thereof; indium-tin oxide (ITO), indium zinc oxide and other conductive metal oxides and mixtures thereof; polysilicon; doped amorphous silicon; metal silicides; metal carbides, metal nitrides and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. In one embodiment, the controllably conductive media contains at least one organic semiconductor layer that is adjacent a passive layer (without any intermediary layers between the organic semiconductor layer and passive layer).

The organic semiconductor layer contains at least one of an organic material (such as a conjugated organic monomer, oligomer or polymer), an organometallic compound (such as a conjugated organometallic compound), an organometallic material (such as a conjugated organometallic monomer, oligomer or polymer), a buckyball, a carbon nanotube (such as a C6-C60 carbon nanotubes), and the like. Organic semiconductors thus have a carbon based structure, often a carbon-hydrogen based structure, which is different from conventional MOSFETs. The organic semiconductor materials are typically characterized in that they have overlapping π orbitals, and/or in that they have at least two stable oxidation states. The organic semiconductor materials are also characterized in that they may assume two or more resonant structures. The overlapping π orbitals contribute to the controllably conductive properties of the controllably conductive media. The amount of charge injected into the organic semiconductor layer also influences the degree of conductivity of the organic semiconductor layer.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminsterfullerene, a soccerball-shaped 60-atom cluster of pure carbon.

The organic polymer typically contains a conjugated organic polymer. The conjugated organic polymer may be linear or branched, so long as the polymer retains its conjugated nature. Conjugated polymers are characterized in that they have overlapping π orbitals. Conjugated polymers are also characterized in that they may assume two or more resonant structures. The conjugated nature of the conjugated organic polymer contributes to the controllably conductive properties of the controllably conductive media.

In this connection, the organic semiconductor layer, such as the conjugated organic polymer, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity-facilitating compound. The ability of the organic semiconductor layer to donate and accept charges and electrically interact with the passive layer also depends on the identity of the conductivity-facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit. The conjugated organic polymer may be linear or branched, so long as the polymer retains its conjugated nature.

In yet another embodiment, the organic semiconductor contains an organometallic polymer (such as a conjugated organometallic polymer), or carbon structures such as carbon nanotubes and Buckyballs. A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single wall nanotubes. A Buckyball is more specifically a Buckminster-Fullerene, a soccerball shaped 60-atom or 70-atom cluster of pure carbon.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 μm or more and about 5 μm or less. In another embodiment, the organic semiconductor layer has a thickness of about 0.01 μm or more and about 2.5 μm or less. In yet another embodiment, the organic semiconductor layer has a thickness of about 0.05 μm or more and about 1 μm or less.

In one embodiment, the organic semiconductor component contains a thin layer designed to improve or lengthen charge retention time. The thin layer may be disposed anywhere within the organic semiconductor layer, but typically near the middle of the layer. The thin layer contains any of the electrode materials or the compounds of the below-described heterocyclic/aromatic compound layer. In one embodiment, the thin layer has a thickness of about 50 Å or more and about 0.1 μm or less. In another embodiment, the thin layer has a thickness of about 100 Å or more and about 0.05 μm or less. For example, an organic memory cell may contain a first electrode of copper, a passive layer of copper sulfide, an organic semiconductor layer of poly(phenylene vinylene), and a second electrode of aluminum, wherein the poly(phenylene vinylene) organic semiconductor layer contains a 50 Å thick layer of copper therein.

In one embodiment, the organic semiconductor material does not contain an organometallic compound. In another embodiment, the organic semiconductor material contains an organic polymer doped with an organometallic compound. In yet another embodiment, the organic memory cells optionally contain an organometallic compound layer. In still yet another embodiment, the organic semiconductor material contains an organometallic compound.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers.

A passive layer contains at least one conductivity-facilitating compound that contributes to the controllably conductive properties of the controllably conductive media. The conductivity-facilitating compound has the ability to donate and accept charges (holes and/or electrons) and/or act as a source of copper ions. The passive layer thus may transport holes, electrons, and/or ions between an electrode and the organic polymer layer/passive layer interface, facilitate charge carrier injection into the organic polymer layer, and/or increase the concentration of a charge carrier (ions, holes and/or electrons) in the organic polymer layer. In some instances, the passive layer may store opposite charges thereby providing a balance of charges in the organic memory device as a whole. Storing charges/charge carriers is facilitated by the existence of two relatively stable oxidation states for the conductivity-facilitating compound.

The Fermi level of the passive layer is close to the valence band of the organic semiconductor layer. Consequently, the injected charge carrier (into the organic semiconductor layer) may recombine with the charge at the passive layer if the energy band of the charged organic semiconductor layer does not substantially change. Positioning energy bands involves compromising between ease of charge injection and length of charge (data) retention time.

The applied external field can reduce the energy barrier between the passive layer and organic layer depending on the field direction. Therefore, enhanced charge injection in the forward direction field in programming operation and also enhanced charge recombination in reversed field in erase operation can be obtained.

The passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the organic polymers may be self aligned in a direction that traverses the electrodes or in a direction away from the passive layer.

Examples of conductivity facilitating compounds that may constitute the passive layer include one or more of copper sulfide ($Cu_xS$, $1 \leq x \leq 2$), copper rich copper sulfide ($Cu_3S$, $Cu_2S$, ), copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), tin oxide ($SnO_2$, $SnO$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), and the like, and mixtures of these materials such as copper sulfide selenide ($CuSSe$). The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

In one embodiment, the passive layer containing the conductivity facilitating compound has a thickness of about 2 Å or more and about 0.1 µm or less. In another embodiment, the passive layer has a thickness of about 10 Å or more and about 0.01 µm or less. In yet another embodiment, the passive layer has a thickness of about 50 Å or more and about 0.005 µm or less.

In order to facilitate operation of the organic memory cells, the organic semiconductor layer is thicker than the passive layer. In one embodiment, the thickness of the organic semiconductor layer is from about 10 to about 500 times greater than the thickness of the passive layer. In another embodiment, the thickness of the organic semiconductor layer is from about 25 to about 250 times greater than the thickness of the passive layer.

In one embodiment, the organic memory cells optionally contain a heterocyclic/aromatic compound layer. In another embodiment, the organic semiconductor layer is doped with a heterocyclic/aromatic compound. If present, the heterocyclic/aromatic compound layer has a thickness of about 0.001 µm or more and about 1 µm or less.

The area size of the individual organic memory cells (as measured by the surface area of the two electrodes directly overlapping each other) can be small compared to conventional silicon based inorganic memory cells such as metal oxide semiconductor field effect transistors (MOSFETs). In one embodiment, the area size of the organic memory cells of the subject invention is about 0.0001 $\mu m^2$ or more and about 4 $\mu m^2$ or less. In another embodiment, the area size of the organic memory cells is about 0.001 $\mu m^2$ or more and about 1 $\mu m^2$ or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds an "ON" threshold value. Switching the organic memory cell to the "off" state from the "on" state occurs when an external stimuli is less than another "OFF" threshold value. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value $V_{ON}$ permits an applied voltage to write information into the organic memory cell and the presence of an external stimuli such as an applied electric field that is less than a threshold value $V_{ON}$ permits an applied voltage to read information from the organic memory cell; whereas the presence of the external stimuli of reversed polarity absolute value of which exceeds that of a threshold value $V_{OFF}$ ("off" state) permits an applied voltage to erase information from the organic memory cell.

To write information into the organic memory cell, a voltage or pulse signal that exceeds the threshold $V_{ON}$ is applied. To read information written into the organic memory cell, a voltage or electric field of any polarity is applied, $V_{OFF} < V < V_{ON}$. Measuring the impedance determines whether the organic memory cell is in a low impedance state or a high impedance state (and thus whether it is "on" or "off"). To erase information written into the organic memory cell, a negative voltage or a polarity opposite the polarity of the writing signal that exceeds a threshold value is applied.

The organic memory devices described herein can be employed to form logic devices such as non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 2:
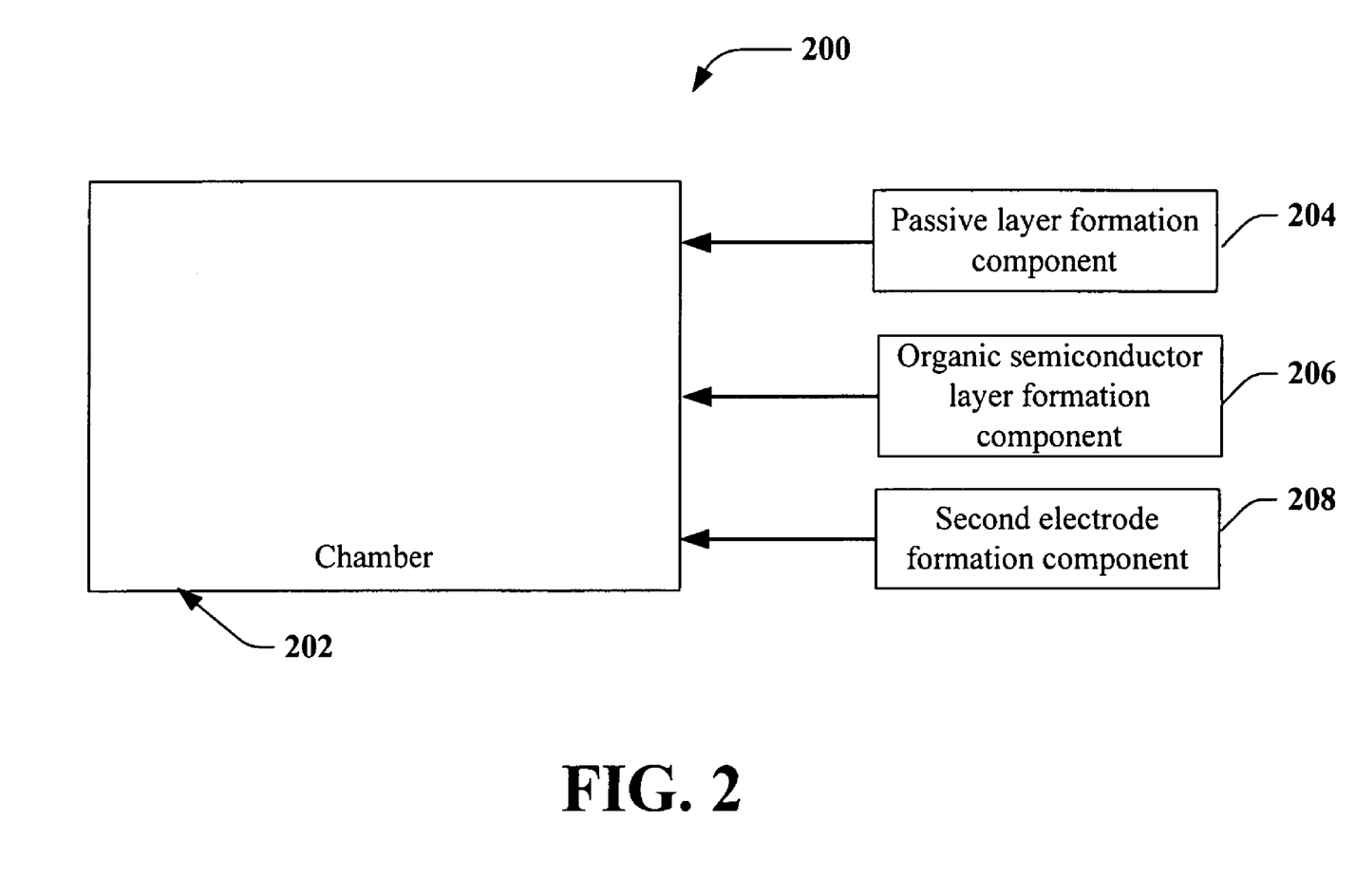
FIG. 2 is a schematic block diagram of an enclosed chamber of an organic memory cell processing system associated with a passive layer formation component and an organic semiconductor layer formation component.

FIG. 2 is a schematic block diagram of an organic memory cell processing system 200 for forming a passive layer and an organic semiconductor layer in accordance with the subject invention. The system 200 includes an enclosed processing chamber 202 defined by a housing having a plurality of walls. The system 200 includes one or more passive layer formation components 204 and one or more organic semiconductor layer formation components 206 associated with the enclosed processing chamber 202. The system 200 may further include one or more second electrode formation components 208. One of ordinary skill in the art would appreciate that any type of process chamber can be used for the subject invention. For example, the chamber may be a CVD chamber, a PVD chamber, or other commonly available semiconductor processing chamber, with appropriate modifications. The enclosed processing chamber 202 suitable to the subject invention can be any enclosure associated with one or more gas and/or liquid inlets to deliver gaseous and/or liquid chemicals for forming the layers and at least one gas and/or liquid outlet for evacuating the enclosure. An enclosed processing chamber 202 may be a single- or multiple-wafer chamber. An enclosed processing chamber 202 may have subchambers.

One or more passive layer formation components 204 can be employed associated with the enclosed processing chamber 202. The passive layer formation component 204 may include a monitoring and controlling component that facilitates, among other things, depositing the conductivity-facilitating compound to a desired thickness. The passive layer formation components 204 may be, for example, a chemical vapor deposition (CVD) component. It is to be appreciated that any suitable passive layer formation components may be employed with the subject invention. For example, components that use physical vapor deposition (PVD) techniques, oxidation techniques, or gas phase reactions may be employed in accordance with the subject invention. Choice of a suitable passive layer formation component 204 depends primarily on the identity of the passive layer material, size of substrates being processed, and to some extent, the composition of an electrode layer or dielectric layer. It is important to understand that each of the various passive layer formation components has its own set of features and characteristics well known in the art.

A passive layer formation CVD component generally includes a CVD reactor and a gas delivery system having conduits for delivery of gases to the chamber. Any suitable passive layer formation components using CVD techniques may be employed with the subject invention. For example, an atmospheric pressure CVD (APCVD), low-pressure CVD (LPCVD), plasma-enhanced CVD (PECVD), or high-density plasma (HDP) may be employed.

In one embodiment, a passive layer formation component 204 may be a PECVD. The PECVD typically comprises a plasma-generating component and a gas delivery component. The PECVD can form various types of passive layer that includes one or more of the following: copper sulfide ($Cu_xS$, $1 \leq x \leq 2$) copper oxide ($CuO$, $Cu_2O$), manganese oxide ($MnO_2$), titanium dioxide ($TiO_2$), indium oxide ($I_3O_4$), silver sulfide ($Ag_2S$, $AgS$), iron oxide ($Fe_3O_4$), and the like. In accordance with one or more aspects of the subject invention, a passive layer formation component 204 may form a thin film of conductivity facilitating material such as copper sulfide ($Cu_xS$, $1 \leq x \leq 2$) on a conductive layer to act as a passive layer and facilitate conductivity between the conductive layer and other layers that will subsequently be formed to comprise a stack making up a memory cell. The passive layer formation component 204 introduces a gaseous form of a sulfide compound above a first electrode, with helium optionally being utilized as a carrier gas, through the gas delivery component. The passive layer formation component 204 may optionally utilize a metal organic gas precursor in the process which facilitates depositing the conductivity facilitating compound at a relative low pressure and temperature conditions (e.g., about 0.2 Pa. and from about 200° C. to about 300° C., respectively). The metal organic precursor can be, for example, chelate Cu (II) diethyldithiocarbamate or $Cu(S_2CN(C_2H_5)_2)_2$ (II).

In one embodiment, one or more passive layer formation components 204 may use oxidation techniques to form a passive layer such as copper sulfide passive layer. For example, a passive layer formation component 204 contacts a first electrode with sulfide compound to form a passive layer comprising copper sulfide. The passive layer formation component 204 may initially and optionally remove or reduce copper oxide that is present on a first electrode comprising copper or a copper alloy. The passive layer formation component 204 may remove or reduce copper oxide by providing a reducing agent, such as NH3, or heating the structure. After optional copper oxide removal/reduction, the passive layer formation component 204 contacts the first electrode with a sulfide compound to form copper sulfide on the first electrode. A mask such as a patterned photoresist may cover portions of the first electrode surface, thus limiting passive layer formation to the exposed portions of the first electrode. The depth of the copper sulfide region within the first electrode depends upon a number of factors including the length of time the sulfide compound is in contact with the first electrode, the temperature, the concentration of the sulfide compound in the processing chamber 202, and the like.

One or more organic semiconductor layer formation components 206 can be employed associated with the enclosed processing chamber 202. The organic semiconductor layer formation component 206 may include a monitoring and controlling component that facilitates, among other things, forming the organic semiconductor material to a desired thickness. The organic semiconductor layer formation component 206 may be, for example, a CVD component. It is to be appreciated that any suitable organic semiconductor layer formation components 206 may be employed with the subject invention. For example, components that use spin-on deposition techniques (depositing a mixture of the polymer/polymer precursor and a solvent, then removing the solvent from the substrate/electrode), PVD techniques, or vacuum deposition techniques may be employed in accordance with the subject invention. Choice of a suitable organic semiconductor layer formation component 206 depends primarily on the identity of the organic semiconductor layer material, size of substrates being processed, and to some extent, the composition of a passive layer or dielectric layer. It is important to understand that each of the various organic semiconductor layer formation components 206 has its own set of features and characteristics well known in the art.

A CVD organic semiconductor layer formation component generally includes a CVD reactor and a gas delivery component having conduits for delivery of organic semiconductor material to the chamber. It is to be appreciated that any suitable CVD organic semiconductor layer formation components 206 may be employed with the subject invention. For example, an atmospheric pressure CVD (APCVD), low-pressure chemical vapor deposition (LPCVD), plasma-enhanced CVD (PECVD), or high-density plasma (HDP) may be employed. In one embodiment, an APCVD organic semiconductor layer formation component 206 generally comprises a muffle component and a gas delivery component. The muffle component provides a gaseous chemicals comprising at least one of the conjugated organic polymer/polymer precursors. The gas delivery component introduces the gaseous chemicals comprising at least one of the conjugated organic polymer/polymer precursors to the chamber and deposits an organic semiconductor layer on the passive layer.

In one embodiment, an organic semiconductor layer formation component 206 may be a component that uses liquid deposition methods to form an organic semiconductor layer on a passive layer. One such method may be a spin-on technique. The spin-on organic semiconductor layer formation component 206 deposits a mixture of the polymer/polymer precursor and a solvent on a substrate/electrode, and then removes the solvent from the substrate/electrode by a spinner. A spin-on organic semiconductor layer formation component 206 may comprise a mixture formation component, a mixture delivery component, and a spinner component. The mixture formation component is optional because the mixture may be commercially available. Another liquid deposition technique may be extrusion where the mixture is delivered and then the substrate is led beneath a doctor's blade to spread the mixture over the passive layer to the desired thickness. The mixture formation and delivery components may be identical with either the spin-on or extrusion component. During formation, the organic semiconductor material self assembles. It is not typically necessary to functionalize one or more ends of the organic polymer in order to attach it to an electrode/passive layer. When using a spin-on organic semiconductor layer formation component 206, the solvent in which the polymer/polymer precursor is charged before application to the wafer structure is able to solubilize the polymer/polymer precursor so that the organic semiconductor layer is formed in a substantially uniform manner over the surface of the substrate.

A mixture formation component of the spin-on organic semiconductor layer formation component 206 provides a mixture of at least one of the conjugated organic polymer/polymer precursor and at least one solvent. The mixture formation component may employ one or more of the following solvents: glycol ether esters, glycol ethers, furans, alkyl alcohols containing from about 4 to about 7 carbon atoms, and the like. The mixture formation component may employ two or more of glycol ether esters, glycol ethers, furans, and alkyl alcohols containing from about 4 to about 7 carbon atoms as a solvent system. The mixture formation component may employ one or more of glycol ether esters, glycol ethers, furans, and alkyl alcohols, and another organic solvent as a solvent system.

The delivery component of the spin-on organic semiconductor layer formation component 206 introduces the mixture of organic semiconductor material and solvent to the chamber and applies the mixture on a substrate/electrode. When applying the mixture, the organic semiconductor layer formation component 206 may hold the mixture at a temperature suitable to facilitate formation of the organic semiconductor layer, facilitate solubilization of the organic semiconductor material and/or permit easy removal of the solvent from the wafer substrate. In one embodiment, the organic semiconductor layer formation component 206 may hold the temperature of the mixture during application from about 0° C. to about 400° C. In another embodiment, the organic semiconductor layer formation component 206 may hold the temperature of the mixture during application from about 10° C. to about 250° C. In yet another embodiment, the organic semiconductor layer formation component 206 may hold the temperature of the mixture during application from about 15° C. to about 150° C.

Then the spinner component of the spin-on organic semiconductor layer formation component 206 removes the solvent from the substrate/electrode by spinning. The spinner component is built in manual, semiautomatic, or automatic designs. The final thickness of the organic semiconductor layer is generally determined by the spin speed, the mixture viscosity, the surface tension, and drying characteristics of the mixture.

One or more a second electrode formation component 208 optionally can be employed associated with the chamber. The second electrode formation component 208 may include a monitoring and controlling component that facilitates, among other things, forming the second electrode to a desired thickness. The second electrode formation component 208 may be, for example, a CVD component or PVD component. It is to be appreciated that any suitable layer formation components may be employed with the subject invention. For example, an atmospheric pressure CVD (APCVD), low-pressure CVD (LPCVD), plasma-enhanced CVD (PECVD), or high-density plasma (HDP) may be employed. Vacuum evaporation component or sputter deposition component may be employed. Choice of a suitable second electrode formation component 208 depends primarily on the identity of the second electrode material, size of substrates being processed, and to some extent, the dielectric layer. It is important to understand that each of the various second electrode formation components 208 has its own set of features and characteristics well known in the art.

A passive layer formation component 204, organic semiconductor layer formation component 206, and second electrode formation component 208 independently perform the layer formation processes under environment other than air. The inert or non-reactive environment may be suitable for facilitating formation of the layers. For example, the chamber may contain one or more of hydrogen ($H_2$), nitrogen ($N_2$), oxygen ($O_2$), helium, neon, argon, krypton, xenon, hydrogen sulfide, and the like. As a result, the passive layer is not exposed to air after formation of the passive layer and before the formation of organic semiconductor layer, thus not causing conductive impurities in the thin film layer and improving, quality, and reliability of organic memory devices. Even if the chamber has subchambers, the layers are not exposed to air because the substrate is not transferred from a subchamber to another subchamber with an air break. The enclosing chamber with subchambers excludes the air.

A passive layer formation component 204, organic semiconductor layer formation component 206, and second electrode formation component 208 may independently perform the optional heat treatment/annealing under an inert or non-reactive environment other than air. For example, the chamber in which heating takers place may contain one or more of hydrogen ($H_2$), nitrogen ($N_2$), helium, neon, argon, krypton, xenon, and a mixture thereof. In one embodiment, a passive layer formation component 204 may heat the passive layer at a temperature from about 50° C. to about 500° C. for about 1 second to about 60 minutes. In another embodiment, a passive layer formation component 204 may heat the passive layer at a temperature from about 70° C. to about 450° C. for about 1 second to about 30 minutes. In yet another embodiment, a passive layer formation component 204 may heat the passive layer at a temperature from about 90° C. to about 400° C. for about 2 seconds to about 15 minutes.

A passive layer formation component 204, organic semiconductor layer formation component 206, and second electrode formation component 208 may independently perform the layer formation processes under a certain temperature in the chamber that is suitable for processing formation of layer. For example, the component may operate at temperatures from about 20° C. to about 600° C.

A passive layer formation component 204, organic semiconductor layer formation component 206, and second electrode formation component 208 independently include a delivery component which is operatively coupled to the chamber for selectively providing gaseous or liquid chemicals into the chamber 202 at various rates, volumes, concentrations, etc. based upon, among other things, the amount (thickness) of film to be formed, the composition of film(s) to be formed, the pressure within the chamber, the temperature within the chamber and/or the size of the chamber, for example. By way of illustration, the gas delivery component includes one or more sources of gaseous medium (a vapor) of one or more chemical(s). In one example, the gases may be provided into the chamber 202 through a conduit that terminates in a nozzle (not shown). It is to be appreciated that more than one nozzle or other gas delivery mechanisms may be utilized to provide gas into the chamber 202 at various mixtures and/or concentrations in accordance with one or more aspects of the subject invention. For example, a shower head type gas delivery mechanism can be implemented to more evenly provide chemicals into the chamber 202 above the wafer, which can facilitate a more uniform chemical vapor deposition on and across the wafer. In one example, the liquid may be provided into the chamber 202 through a conduit. For example, in a spin-on organic semiconductor layer formation process, a mixture of the polymer/polymer precursor and a solvent is delivered by the conduit on a substrate/electrode. An inert or non-reactive gaseous can also be provided into the chamber 202 to avoid air exposure of the passive layer and/or an organic semiconductor layer. It will be appreciated that the delivery component can inject other gases or plasma substances into the chamber 202 to facilitate forming a passive layer, an organic semiconductor layer, or a second electrode.

Figure 3:
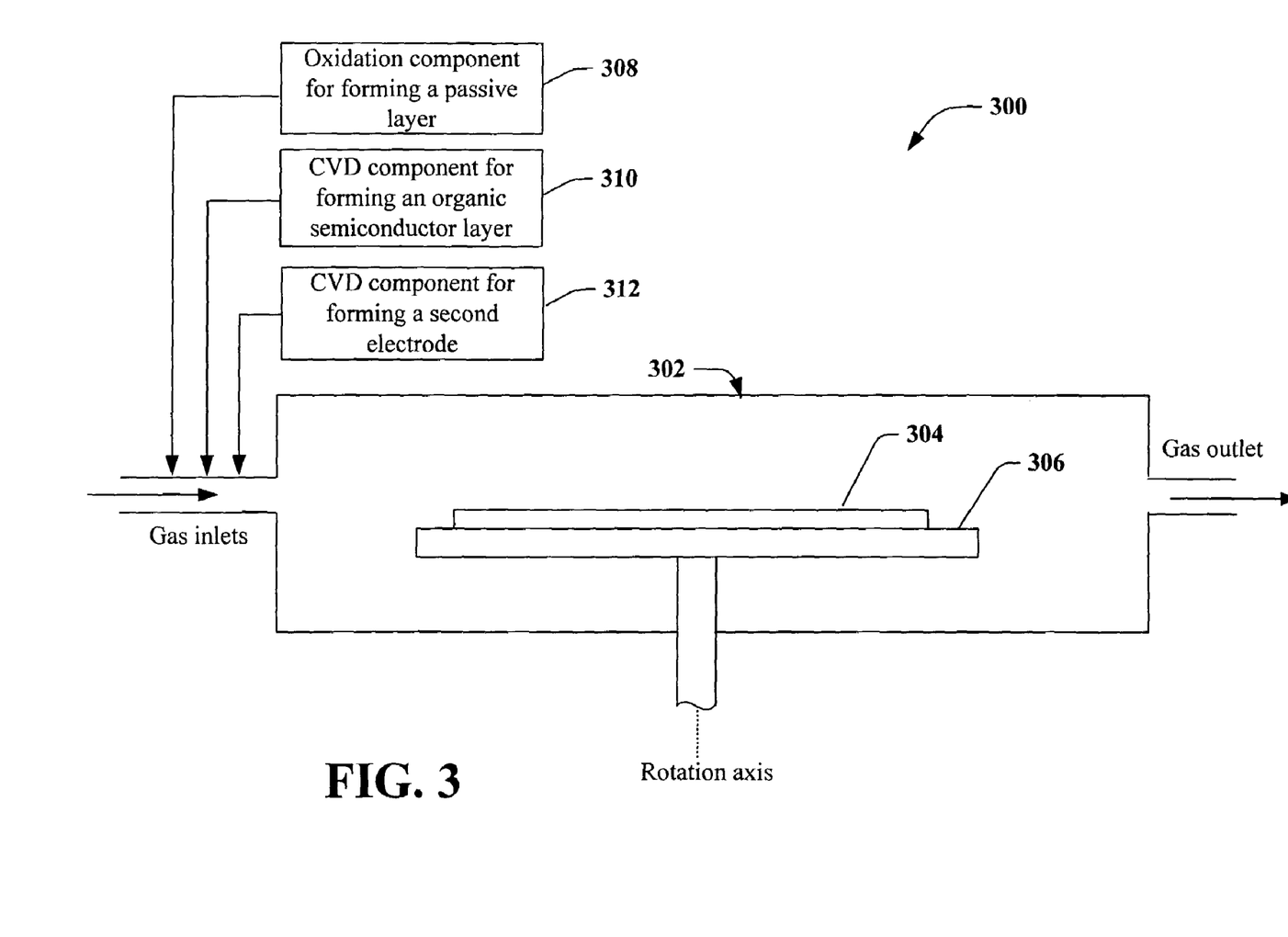
FIG. 3 is a schematic block diagram illustrating an organic memory cell processing system for forming a passive layer, an organic semiconductor layer, and a second electrode in accordance with one or more aspects of the subject invention.

FIG. 3 shows a schematic block diagram illustrating an organic memory cell processing system 300 for forming a passive layer, an organic semiconductor layer, and a second electrode in accordance with one or more aspects of the subject invention. The processing chamber 302 is configured for receiving and processing a wafer 304 in a predefined manner. The chamber 302 has a cylindrical sidewall that encloses a rotatable chuck 306 onto which the wafer (or other substrate) 304 is mounted for processing. The chuck 306 typically includes a vacuum system (not shown) for holding the wafer 304 on its surface during processing. The chamber 302 has gas inlets for conveying gases to the chamber 302 and a gas outlet for removing gases from the chamber 302. The inlets are connected to an oxidation component 308 for forming a cupper sulfide passive layer, a CVD component 310 for forming an organic semiconductor layer on the passive layer, and a CVD component 312 for forming a second electrode on the organic semiconductor layer.

The oxidation component 308 for forming a cupper sulfide passive layer comprises a $NH_3$ generator and a $H_2S/N_2$ generator. The oxidation component 308 pretreats the surface of a first electrode comprising copper formed in the wafer 304 before oxidation. The oxidation component 308 provides the chamber 302 with $NH_3$ through the gas inlet to remove copper oxide that is present on the surface of the first electrode. For example, a mixture containing about 3% by weight of ammonia and about 97% by weight of nitrogen is contacted with the surface of the first electrode for about 2 minutes at a temperature of about 360° C. Then the oxidation component 308 injects $H_2S/N_2$ into the chamber 302 to form a copper sulfide passive layer within the first electrode. In the chamber 302, the sulfide compound mixture is contacted with the electrode for a time from about 1 second to about 60 minutes at a temperature from about 15° C. to about 500° C. For example, a mixture containing about 2% by weight of hydrogen sulfide and about 98% by weight of nitrogen is contacted with the electrode comprising copper for about 2 minutes at a temperature of about 360° C. to form copper sulfide layer.

After the oxidation component 308 forms a copper sulfide passive layer, the CVD component 310 forms an organic semiconductor layer on the passive layer. The CVD comprises 310 a chemical vapor generating component and the gas inlet. The chemical vapor-generating component generates chemical vapor of organic semiconductor and the gas inlet injects the vapor into the chamber 302 to form the organic semiconductor layer on the passive layer. By way of example, the chemical vapor deposition of polyphenylacetylene can be carried out in oxygen at a temperature from about 30° C. to about 100° C. and at a pressure from about 0.05 Pa to about 0.5 Pa. Then, the CVD component 312 forms the second electrode on the organic semiconductor layer.

Figure 4:
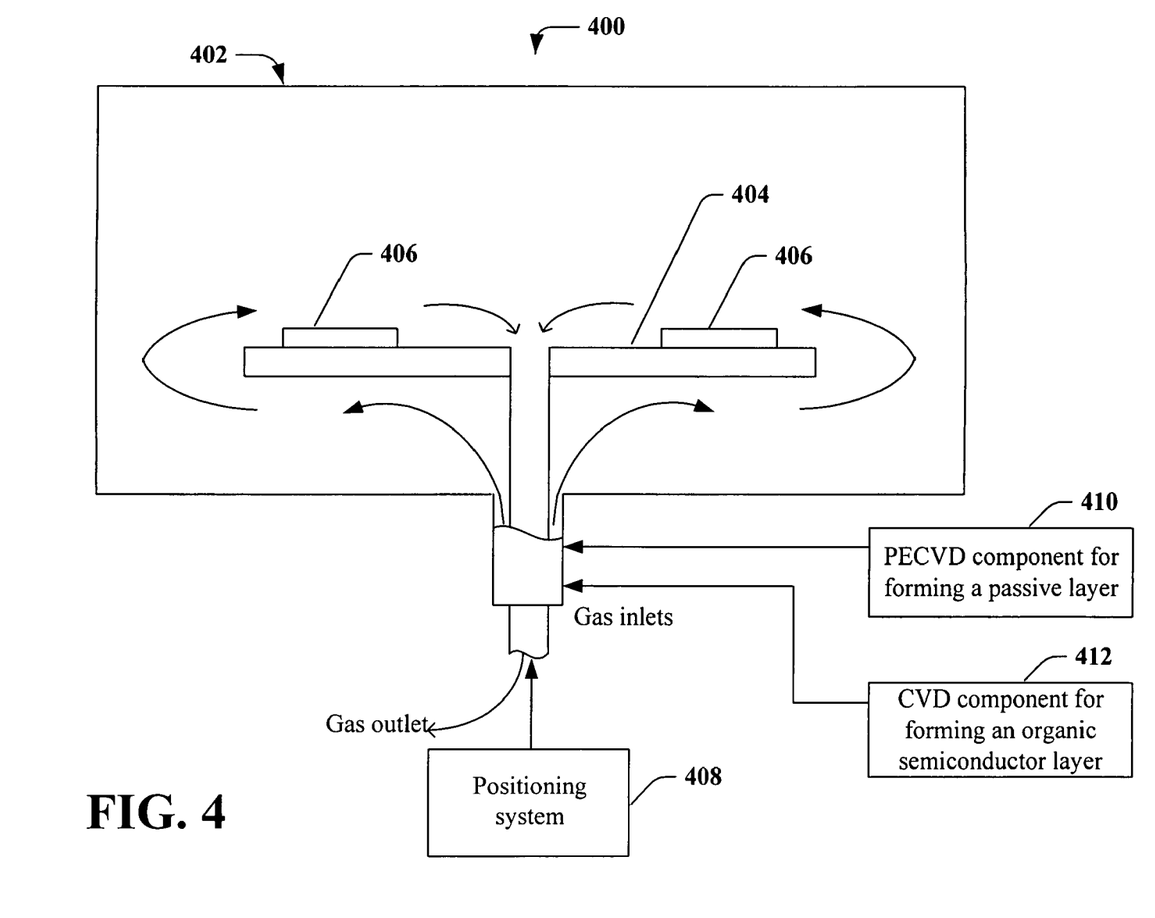
FIG. 4 is a schematic block diagram illustrating an organic memory cell processing system for forming a passive layer and an organic semiconductor layer in accordance with one or more aspects of the subject invention.

FIG. 4 shows a schematic block diagram illustrating an organic memory cell processing system 400 for forming a passive layer and an organic semiconductor layer in accordance with one or more aspects of the subject invention. The processing chamber 402 is configured for receiving and processing wafers in a predefined manner. The chamber 402 has a cylindrical sidewall that encloses a rotatable chuck 404 onto which six wafers are mounted for processing. A positioning system 408 is operatively connected to the rotatable chuck 404 for selectively maneuvering the wafers 406 into desired positions within the chamber 402. The chuck 404 typically includes a vacuum system (not shown) for holding the wafers on its surface during processing. The chamber 402 has gas inlets for conveying gases to the chamber 402 and a gas outlet for removing gases from the chamber 402. A PECVD component 410 for forming a cupper sulfide passive layer and a CVD component 412 for forming an organic semiconductor layer on the cupper sulfide passive layer are connected to the gas inlets.

The PECVD component 410 for forming a copper sulfide passive layer comprises a plasma-generating component and the gas inlet. The plasma-generating component generates plasma enhanced chemical vapor of hydrogen sulfide and the gas inlet injects the vapor into the chamber 402. By way of example, the plasma enhanced chemical vapor deposition of copper sulfide can be carried out in argon at a temperature from about 15° C. to about 300° C. and at a pressure from about 0.05 Pa to about 0.5 Pa.

The CVD component 412 for forming an organic semiconductor layer on the cupper sulfide passive layer comprises a chemical vapor generating component and the gas inlet. The chemical vapor-generating component generates chemical vapor of organic semiconductor and the gas inlet injects the vapor into the chamber 402 to form the organic semiconductor layer on the passive layer. By way of example, the chemical vapor deposition of organic semiconductor can be carried out in oxygen at a temperature from about 30° C. to about 100° C. and at a pressure from about 0.05Pa to about 0.5Pa.

Fabrication of memory cell consists of multiple steps of layer formation. The layers are not exposed to air between the formation steps. That is, the layers are not exposed to air because the substrate is not transferred from a chamber to another chamber. Since exposure may cause conductive impurities in the thin film layer, lack of exposure mitigates the introduction of impurities. Therefore, impurities that can negatively impact the quality of the manufactured chip by altering the desired electrical properties of and interactions between components on the manufactured chip would not occur in accordance with the subject invention.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making an organic memory cell, comprising:
   holding one or more substrates comprising a first electrode comprising copper in an enclosed processing chamber;
   removing copper oxide on the first electrode by contacting the first electrode with a reducing agent or heating the first electrode in the enclosed processing chamber;
   contacting a sulfide compound with the first electrode to form a passive layer comprising copper sulfide on the first electrode in the enclosed processing chamber;
   forming an organic semiconductor layer on the passive layer in the enclosed processing chamber, wherein the passive layer is not exposed to air after formation of the passive layer and before formation of the organic semiconductor layer; and
   forming a second electrode on the organic semiconductor layer in the enclosed processing chamber.

2. The method of claim 1, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; poly- sexithiofene; poly(siliconoxohemiporphyrazine); poly(germaniumoxohemiporphyrazine); poly(ethylenedioxythiophene); polymetallocene complexes; and polypyridine metal complexes.

3. The method of claim 1, wherein the second electrode comprises at least one selected from the group consisting of aluminum, chromium, cobalt, copper, germanium, hafnium, gold, magnesium, manganese, molybdenum, indium, iron, nickel, palladium, platinum, samarium, silver, titanium, tungsten, zinc, and alloys thereof; indium-tin oxide and indium zinc oxide and other conductive metal oxides and mixtures thereof; and metal silicides, metal carbides and metal nitrides.

4. The method of claim 1, wherein forming the organic semiconductor layer is performed by chemical vapor deposition.

5. The method of claim 1, wherein the one or more substrates are held in the enclosed processing chamber, the enclosed processing chamber being connected to a passive layer formation component, an organic semiconductor layer formation component, and a second electrode formation component.

6. The method of claim 1, wherein the substrate is mounted onto a rotatable chuck in the enclosed processing chamber.

7. The method of claim 1, wherein the substrate is not transferred from the enclosed processing chamber to another chamber while making the organic memory cell, and the layers are not exposed to air.

8. The method of claim 1, wherein the first electrode is contacted with hydrogen sulfide to form the passive layer comprising copper sulfide for a time from about 1 second to about 60 minutes at a temperature from about 15° C. to about 500° C.

9. A method of processing an organic memory cell, comprising:
   holding one or more substrates comprising a first electrode comprising copper in an enclosed processing chamber comprising a gas inlet, the gas inlet connected to an oxidation component for forming a cupper sulfide passive layer on a first electrode, a CVD component for forming an organic semiconductor layer on a passive layer, and a CVD component for forming a second electrode on an organic semiconductor layer;
   contacting the electrode with ammonia to reduce copper oxide to copper and contacting the first electrode with a sulfide compound to form a passive layer comprising copper sulfide on the first electrode in the enclosed processing chamber using the oxidation component for forming a cupper sulfide passive layer;
   forming an organic semiconductor layer on the passive layer in the enclosed processing chamber using the CVD component for forming an organic semiconductor layer, wherein the passive layer is not exposed to air after formation of the passive layer and before formation of the organic semiconductor layer; and
   forming a second electrode on the organic semiconductor layer in the enclosed processing chamber using the CVD component for forming a second electrode;
   wherein the substrate is not transferred from the enclosed processing chamber to another chamber while processing the organic memory cell, and the layers are not exposed to air.

10. The method of claim 9, wherein the substrate is mounted onto a rotatable chuck in the enclosed processing chamber.

11. The method of claim 9, wherein the first electrode is contacted with hydrogen sulfide to form the passive layer comprising copper sulfide for a time from about 1 second to about 60 minutes at a temperature from about 15° C. to about 500° C.

12. The method of claim 9, wherein forming the organic semiconductor layer is performed by chemical vapor deposition.

13. The method of claim 9, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

14. The method of claim 9, wherein the second electrode comprises at least one selected from the group consisting of aluminum, chromium, cobalt, copper, germanium, hafnium, gold, magnesium, manganese, molybdenum, indium, iron, nickel, palladium, platinum, samarium, silver, titanium, tungsten, zinc, and alloys thereof; indium-tin oxide and indium zinc oxide and other conductive metal oxides and mixtures thereof; and metal silicides, metal carbides and metal nitrides.

* * * * *